(12) United States Patent
Lu et al.

(10) Patent No.: US 7,502,390 B2
(45) Date of Patent: Mar. 10, 2009

(54) OPTIMIZED INTERLEAVER AND/OR DEINTERLEAVER DESIGN

(75) Inventors: Jun Lu, San Jose, CA (US); Hossein Dehghan, Danville, CA (US); Xi Huang, Fremont, CA (US)

(73) Assignee: LSI Corporation, Milpitas, CA (US)

( * ) Notice: Subject to any disclaimer, the term of this patent is extended or adjusted under 35 U.S.C. 154(b) by 1146 days.

(21) Appl. No.: 10/696,912

(22) Filed: Oct. 30, 2003

(65) Prior Publication Data
US 2005/0094677 A1   May 5, 2005

(51) Int. Cl.
*H04J 3/04* (2006.01)
(52) U.S. Cl. .................................... 370/535
(58) Field of Classification Search ......... 370/535–538; 711/1–173
See application file for complete search history.

(56) References Cited

U.S. PATENT DOCUMENTS

| 6,018,776 A * | 1/2000 | Wise et al. ............. 710/7 |
|---|---|---|
| RE37,048 E * | 2/2001 | McCollum ............. 708/230 |
| 2003/0144828 A1 * | 7/2003 | Lin ............................. 703/21 |
| 2004/0181556 A1 * | 9/2004 | Ko et al. .................... 707/200 |
| 2005/0094677 A1 * | 5/2005 | Lu et al. .................... 370/535 |

* cited by examiner

*Primary Examiner*—Seema S Rao
*Assistant Examiner*—Jianye Wu
(74) *Attorney, Agent, or Firm*—Christopher P. Maiorana, PC

(57) ABSTRACT

An apparatus comprising an input circuit, a storage circuit and an output circuit. The input circuit may be configured to generate a plurality of data paths in response to an input data signal having a plurality of data items sequentially presented in a first order. The storage circuit may be configured to store each of the data paths in a respective shift register chain. The output circuit may be configured to generate an output data signal in response to each of the shift register chains. The output data signal presents the data items in a second order different from said first order.

15 Claims, 5 Drawing Sheets

OPTIMIZED INTERLEAVER AND/OR DEINTERLEAVER DESIGN

FIELD OF THE INVENTION

The present invention relates to broadband communications generally and, more particularly, to a method and/or circuit for implementing an optimized interleaver and/or deinterleaver that may be used in a communications system, such as an asynchronous digital subscriber line (ADSL) system.

BACKGROUND OF THE INVENTION

Conventional interleaver and deinterleaver approaches use simple surrounding logic and a memory unit. Such approaches are useful for short codewords with a short depth. For example, a N*D memory matrix is used where N is an integer representing the length of the codeword while D is an integer representing the depth of the interleaver. This is a common method used in many conventional data storage and communication systems.

However, such conventional implementations of interleavers and deinterleavers do not optimize memory usage. When the codeword is long and depth is large (which can occur in some special cases), the unoptimized memory usage can be a problem for the design of an application specific integrated circuit (ASIC). Even with a software only implementation, unoptimized memory usage is a problem when both the length and depth are large.

It would be desirable to implement an interleaver and/or deinterleaver in a broadband environment (e.g., ADSL) that optimizes memory usage, particularly when the length and depth of the codeword are large.

SUMMARY OF THE INVENTION

The present invention concerns an apparatus comprising an input circuit, a storage circuit and an output circuit. The input circuit may be configured to generate a plurality of data paths in response to an input data signal having a plurality of data items sequentially presented in a first order. The storage circuit may be configured to store each of the data paths in a respective shift register chain. The output circuit may be configured to generate an output data signal in response to each of the shift register chains. The output data signal presents the data items in a second order different from the first order.

The objects, features and advantages of the present invention include providing an interleaver and/or deinterleaver that may (i) reduce and/or optimize memory usage and/or (ii) simplify the design by reducing the surrounding logic.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention may optimize the memory used in either a hardware or a software design of an interleaver and/or deinterleaver. Interleavers and deinterleavers are basic building blocks in data storage and communication systems. The present invention may be used in any system using interleavers and deinterleavers. The present invention may be particularly applicable for a hardware application specific integrated circuit (ASIC) design. The present invention may also be used in the software design for an interleaver and/or deinterleaver. The present invention may also provide a general implementation to implement multiple interleavers and deinterleavers for multiple communication channels. Such multi-channel systems may save even more memory than single interleaver systems. The present invention may be useful in an asymmetrical digital subscribe line (ADSL) environment.

An interleaver/deinterleaver is a pair of building blocks normally used in a digital control and communication system to increase the stability of the system. In general, interleaving spreads the consecutive burst errors introduced into the system to many non-consecutive places so that errors may be easily detected or corrected by, for example, a forward error control (FEC) coding block.

Figures 1, 2:
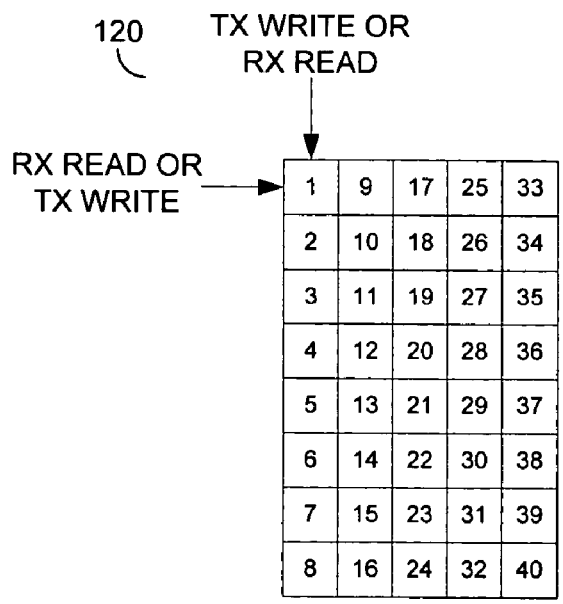
FIG. 1 is a diagram illustrating a basic interleaver.
FIG. 2 is a diagram illustrating an interleaver read and write operation.

Referring to FIG. 1, a diagram of a matrix 100 illustrating a block interleaving example is shown. The matrix 100 illustrates the basic operation of an interleaver. In the matrix 100, a block of forty data portions 1-40 are sent. The data positions 11 to 17, shown with shading, are positions subjected to noise which may cause a corruption of one or more data items. Data correction systems may have difficulty correcting for long consecutive errors. However, if the data is read column by column, only one or two of the data portions 1-40 are corrupted in each column. Isolating corrupted data to non-sequential positions allows a much easier implementation of data correction. An interleaver is normally used in a transmitter to "scramble" the data while a deinterleaver is used in the receiver to "de-scramble" the data and spread the errors.

Referring to FIG. 2, a diagram of a memory matrix 120 illustrating a block interleaver implementing read and write operations is shown. The block interleaver 120 has a simple structure and can be easily implemented. However, the block interleaver 120 uses large amounts of memory and can introduce long delays into the system. At the transmitters, the input data portions 1-40 are placed into the memory matrix 120 column by column and read out line by line. At the receiver, the data are put into the same size memory matrix line by line and read out column by column. The receiver can recover the data in order. However, the data is generally recovered with 2*N*D delays in which N is an integer representing the interleaver length and D is an integer representing the interleaver depth. To implement the interleaver and the deinterleaver pair, 2*N*D memory locations are generally needed.

In a block interleaver, data are scrambled in a way that the consecutive data may be separated evenly after the interleaving process. For example, in the memory matrix 120, when the data is read out line by line the distance between data number one and data number two is five, which matches the interleave depth.

Figure 3:
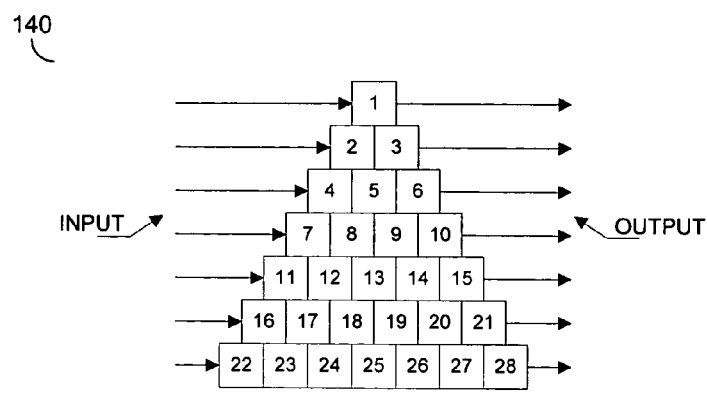
FIG. 3 is a block diagram illustrating a convolutional interleaver.

Referring to FIG. 3, an example of a memory matrix 140 illustrating a convolutional interleaver is shown. Unlike a block interleaver, the distance between consecutive data after convolutional interleaving is generally not the same. For example, in the memory matrix 140, the input data generally have different delays at the output of the interleaver because the input data propagate through different delay paths. For example, one path may propagate through the memory blocks 2 and 3. Another path may propagate through the memory block 4, 5 and 6. The number of memory blocks 1-28 influences the delay. Implementing a convolutional interleaver may be more complicated in structure than the block interleaver. However, a convolutional interleaver has other advantages such as short delays (N*D) and less memory (N*D) The value D is the longest shift register length. In this example, the D is 7. The length is the number of rows. In this example, the value of N is 7.

The interleaver and deinterleaver in commercial products (such as the HOMEBASE ADSL system available from LSI Logic in Milpitas, Calif.) may be used together with Reed Solomon FEC code to combat the impulse noise on a twisted pair telephone line. The interleaver and deinterleaver spread potential burst errors introduced by impulse noise to many different RS codes such that the errors can be more easily corrected by the RS decoder.

For example, in a customer premise (CPE) modem, the upstream data rate is generally low and the specification for the interleaver is that the length of the interleaver may be from 1 to 255, while the depth of the interleaver may be two raised to the power of k, where k may range from 0 to 4. For downstream transmission, the data rate is high. A typical specification for the deinterleaver is that the length of the deinterleaver may be from 1 to 255, while the depth of the deinterleaver may be two raised to the power of k, where k may range from 0 to 6. The length and depth parameters should always be mutual prime (e.g., the greatest common divisor of two integers is one). A dummy byte may need to be added in the case where an even number of bytes is to be transmitted.

The memory usage for the interleaver and deinterleaver in a typical design is (N*D), where N is an integer representing the codeword length and D is the interleaver depth. For example, for an upstream transmitter, 4K bytes of memory are typically used. For a downstream receiver, 16K bytes of memory are typically used.

There are two main design constraints for the interleaver and deinterleaver design for the ADSL system. A first constraint is that the delay introduced by the interleaver and deinterleaver pair should be equal to or less than 16 ms. A second constraint is that the system should be able to correct 0.5 ms burst errors introduced by potential impulse noise on the line.

The following is an example to illustrate that the interleaver and deinterleaver could meet these two constraints. If the data rate is 7584 kbps then the DMT symbol rate is 4 ksps. The number of bytes used to transmit per RS codeword is 7584*0.25/S=237. After adding 18 bytes of redundancy, 255 bytes of data are generally transmitted. If the data are interfered with by a 0.5 ms impulse noise, there will be 255*(0.5/0.25)=510 bytes of data that get corrupted. The depth of the interleaver has to be at least 510/(18/2)=64. The largest depth of the deinterleaver should also be 64. In this case, the delay introduced by the interleaver and deinterleaver pair is about (255*64)/(255*4)=16 ms which meets the specification for ADSL.

Figure 4:
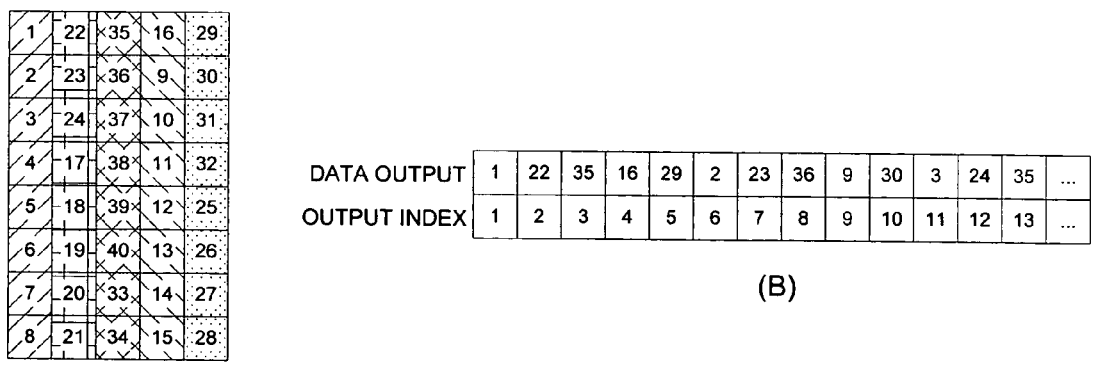
FIGS. 4A and 4B illustrate a helical structure of an interleaver.

Referring to FIGS. 4a and 4b, an interleaver implementing a helical structure is shown. FIG. 4a illustrates the arrangement of data input to the memory matrix. FIG. 4b illustrates an example interleaver output. The basic idea of the helical structure is that the delay for the $k^{th}$ byte of the input data is $(k-1)*(D-1)$, where D is the interleaver depth and the input data index starts from 1. In one example, N=8 and D=5. The input data 1-40 are written column by column while the output data 1-40 are read row by row. The order of the input data 1-40 is generally arranged so that the output data delay may be represented by the expression $(k-1)*(D-1)$. For example, data number 9 starts at row number 2 and column number 4. In the output, the data number 1 and the data number 9 have no delays (e.g., data number and output index are the same).

The advantage of the helical structure implementation of the interleaver and deinterleaver is that it is very straightforward and the surrounding logic is quite simple. While the disadvantage is that a lot of memory is used. The present invention optimizes the interleaver/deinterleaver to save some memory. The present invention keeps the basic functionality of the interleaver and deinterleaver.

Figure 5:
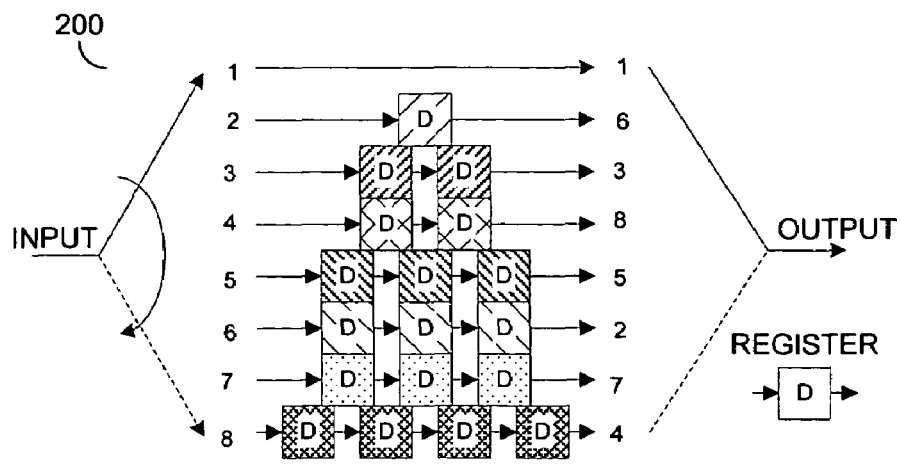
FIG. 5 is a block diagram illustrating a shift register implementation of a helical convolutional interleaver.

Referring to FIG. 5, a shift register implementation of a helical structured convolutional interleaver 200 is shown. The triangular shift register structure is generally used to implement a helical convolutional interleaver. The main task for the interleaver 200 is to interleave the input data in the same order as the interleaver shown in FIG. 4. Three criteria need to be determined for proper operation: (1) how the input data sequence is stored into the shift registers; (2) how many shift register are implemented at each row of the register bank; and (3) how the output data of the shift register bank is read out.

The numbers in front of each shift register group (e.g., 1, 2, 3, 4, 5, 6, 7, 8) represent the order data is shifted into the rows of the shift register matrix. The input order is generally sequential. The numbers at the output side of each shift register group (e.g., 1, 6, 3, 8, 5, 2, 7, 4) represent the order in which data is shifted out of the rows of the shift register matrix. The output order is generally not sequential. In general, each square box represents a register. Several cascaded registers generally form a shift register group.

Figure 6:
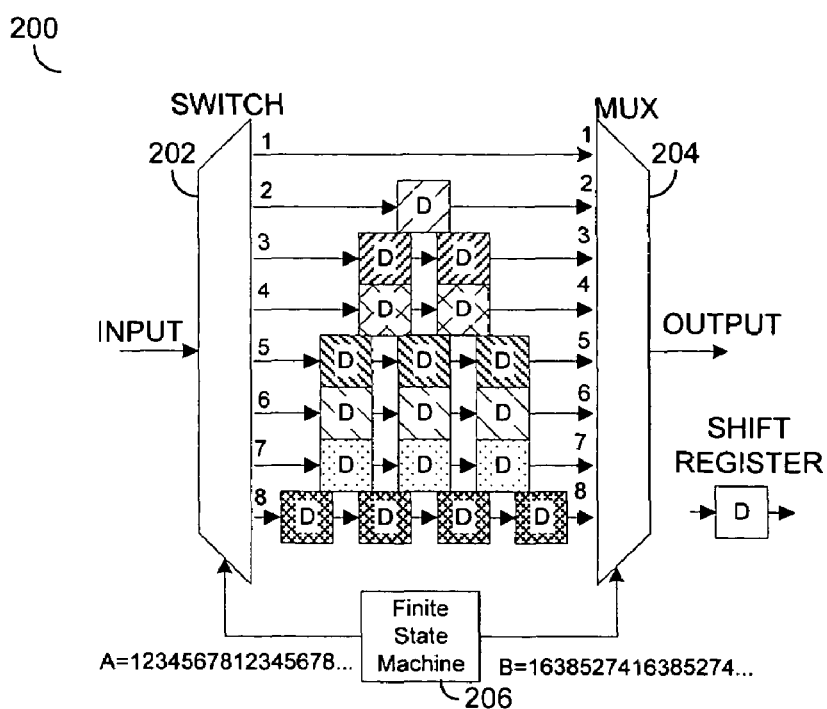
FIG. 6 is a more detailed block diagram of the interleaver of FIG. 5.

Referring to FIG. 6, a more detailed diagram of the interleaver 200 is shown. A de-multiplexer (or switch) 202 controls the order the data is presented to the shift register groups. A multiplexer 204 controls the order the data is retrieved from the shift register groups for presentation to the output. Control signals (e.g., A and B) are generated by a finite state machine 206. The control signals A and B generally have predetermined periodic values to control the data flow. For example, the signal A may have the values 12345678123456781234S, etc., while the signal B may have the values such as 16385274163852741638, etc. The switch 202 and the multiplexer 204 are used to select the correct data inputs and outputs. The numbers at the switch output 202 and at the multiplexer input 204 are shown for labeling purpose and are different from the numbers in FIG. 5 (which represent the order the data are presented).

The interleaver 200 illustrates an example when the data is input into the shift register bank row by row. By observing the data output of the helical structured interleaver, two equations may be derived for the determination of criteria number (2) and (3) above. The number of register needed for each row is generally determined by the following equation EQ1:

EQ1 Number of registers for each row=floor$((k-1)*(D-1)/N)+1$, $k=2,3,\ldots,n$     (1)

in which k the row number, D is the depth of the interleaver and N is the length of the interleaver. The first row suffers no delay and generally has no register.

Data in the shift register is not normally read out row by row at the output of the shift register. A read order is generally calculated to a data output similar to the one shown in FIG. 4b. The following equation EQ2 may be used:

EQ2 $p(\text{MOD}((k-1)*D, N)+1)=k$, $k=1,2,\ldots,n$     (2)

where (i) the array p may be obtained where p(k)=m and (ii) where m means the mth row was read out the kth time.

From the equations EQ1 and EQ2 above, all three questions listed above may be solved. The output of the register bank convolutional interleaver 200 generally matches with the helical structured interleaver of FIG. 4. However, the register implementation of the convolutional interleaver may not be flexible enough for an ASIC implementation because the length and depth of the interleaver may be different for each DSL connection. Also, in the ASIC design, a shift register is not compact and a lot of gates are generally used. A memory implementation is generally more preferable.

Figure 7:
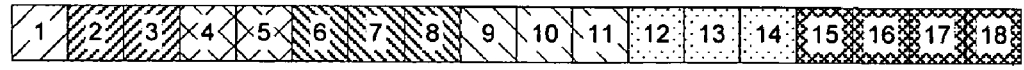
FIG. 7 is a diagram illustrating a memory structure of an interleaver.

Referring to FIG. 7, a memory structure of the interleaver is shown. By observing FIG. 5, the shift register bank represents a memory unit. The shift register bank structure may be changed to a memory read and write structure if the amount of memory and the order of accessing the memory is known. Equations EQ1 and EQ2 may be used for this calculation. The order of the read and write may be accommodated by the state machine 206.

Figure 8:
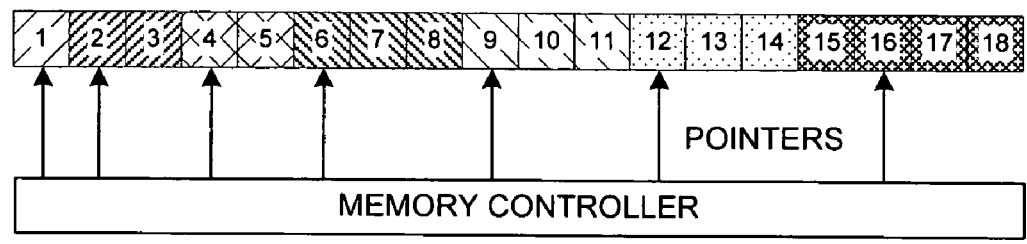
FIG. 8 is a diagram illustrating an interleaver or deinterleaver memory structure with a memory controller.

In FIG. 7, the different hatchings represent the different rows in the FIG. 5. The numbers inside the square boxes are the order in which the input data is stored into the memory. When data are input to the memory for each row in FIG. 5 (or each memory group with a particular hatching), the shift register bank or the memory group operates as a FIFO (first in first out) memory. In the memory implementation, after the FIFO is full, the write pointer returns to the beginning to write any new data and overwrite the old data. A separate write pointer may be implemented for each memory group. The pointer address is generally initialized to indicate where in the memory each of the FIFOs start. FIG. 8 illustrates a memory controller illustrating various pointers.

Unlike the shift register bank implementation, in a memory implementation, the starting address for each group of memory and the length of each group of memory needs to be calculated. The two sets of parameters may be calculated and stored in memory locations by firmware. The hardware may be configured to grab the initialized parameters to implement the interleaving.

By adding a minor amount of control logic, the present invention may save memory in the ASIC design. For example, in a case where the deinterleaver depth is 64 and the length is 255, the old design uses 16K bytes of memory while the present invention only employs 5K of memory plus some control logic and about one-half kB for address and length parameter initialization. That is about 7K bytes of memory saved. For the interleaver at the transmitter side, a memory savings from 4K to 2.5K may be realized.

For some communication systems, multiple interleavers and deinterleavers may be used for different communication channels. For example, for the new ADSL2 standard, four interleavers and deinterleavers are required at the TX and the RX side for four latency paths. If conventional interleaving and deinterleaving approaches are used, there will be a lot of memory on the chip, which is very expensive.

If the present invention is used for the interleaver and deinterleaver, about half of the memory may be saved. The extra logic added to handle the addressing and calculations is very limited. For example, if the TX depth is 8 and length is 255, while RX depth is 64 and length is 255, at least 72K bytes of memory are needed for four interleaver and deinterleaver pairs using the old solution. While the present invention uses about 40K bytes of memory. The present invention may provide a huge savings for the ASIC design.

Figure 9:
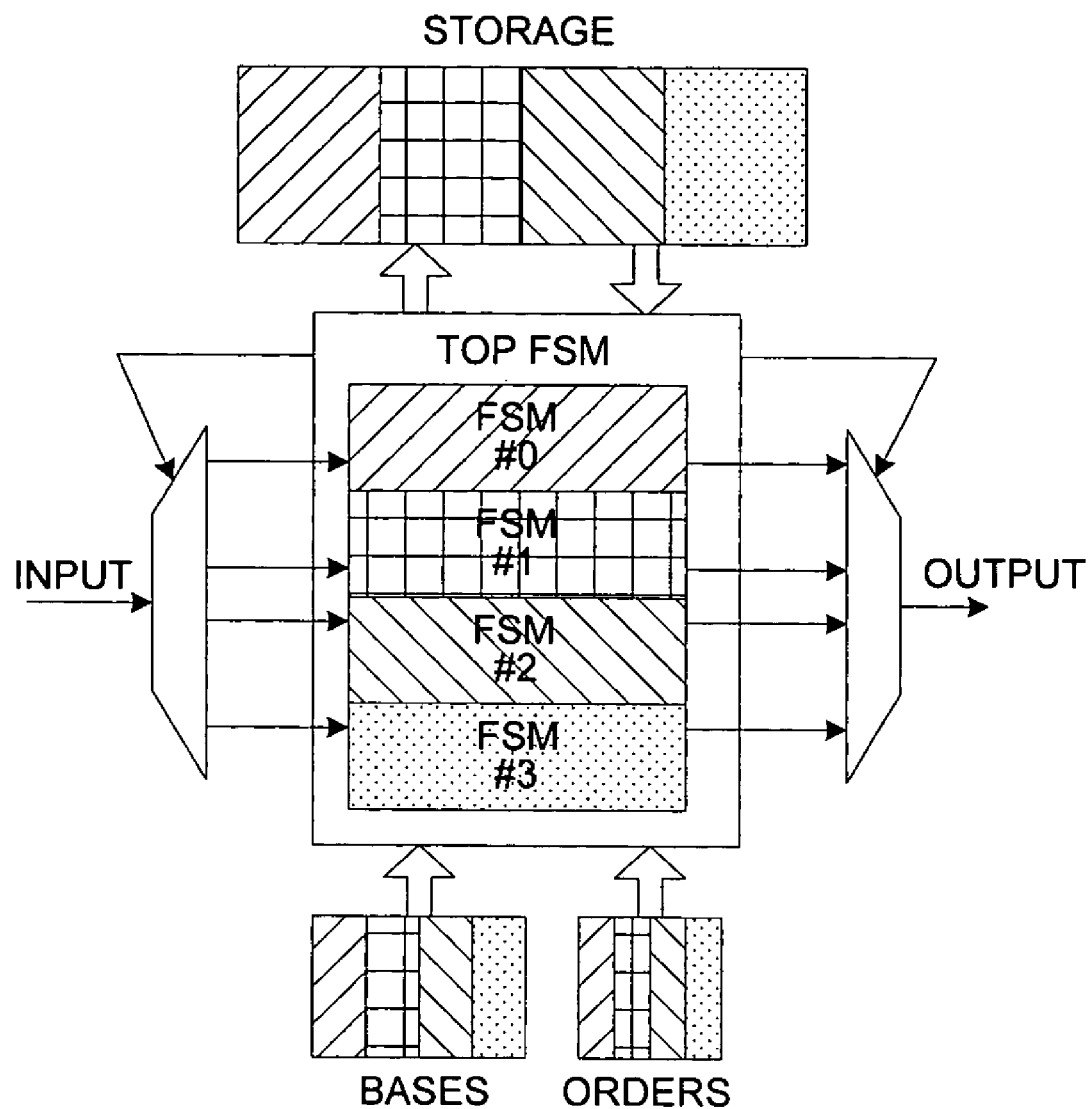
FIG. 9 is a diagram illustrating an example of a multi-channel system with four interleavers or four deinterleavers.

Referring to FIG. 9, a detailed hardware architecture for a four interleavers and four deinterleavers implementation is shown. The memories used for multiple interleavers and deinterleavers may be combined instead of using small pieces of memories. The memories used for parameter storage (e.g., base address calculation and read/write order) may be combined separately for the multiple interleavers and deinterleavers.

The interleaver and/or deinterleaver of the present invention may be implemented in hardware, software, and/or firmware. The process of the present invention may be implemented and executed using an ASIC, pure software, firmware, digital signal processor, digital signal controller, etc.

The read and write memory process of the present invention may be implemented byte by byte as well as codeword by codeword. For example, on the interleaver side, one codeword including N bytes may be written into memory first, then one codeword including N bytes may be read out from the memory. Both byte by byte process and codeword by codeword process should work. A codeword by codeword process may save some overhead process time and logic.

The interleaver and/or deinterleaver may be implemented using on-chip memory, off-chip memory, or a combination of each. If off-chip memory is implemented, the overall cost of the system may be reduced.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
    an input circuit configured to generate a plurality of data paths in response to an input data signal having a plurality of data items sequentially presented in a first order;
    a storage circuit configured to store each of said data paths in a respective shift register chain; and
    an output circuit configured to generate an output data signal in response to each of said shift register chains, wherein (i) said output data signal presents said data items in a second order different from said first order, (ii) a first group of said shift register chains having a first number of registers is configured to have a first delay, a second group of said shift register chains having a second number of registers different from said first number of registers is configured to have a second delay and a third group of shift register chains having said second number of shift registers is configured to have said second delay, (iii) said input circuit transfers said input data to said shift register chains according to a first shift order and said output circuit reads said output data from said shift register chains according to a second shift order different from said first shift order, (iv) said configuration of said shift register chains is configured to enable said output circuit to present said data in said second order while generating a delay less than a total number of said plurality of shift register chains, and (v) said second order comprises an interleaved order.

2. The apparatus according to claim 1, wherein said second order comprises a sequential presentation of said plurality of data items.

3. The apparatus according to claim 1, wherein said input circuit comprises a demultiplexer circuit.

4. The apparatus according to claim 1, wherein said output circuit comprises a multiplexer circuit.

5. The apparatus according to claim 1, wherein said input circuit is controlled by a finite state machine.

6. The apparatus according to claim 5, wherein said output circuit is controlled by said finite state machine.

7. The apparatus according to claim 1, wherein each of said data paths is configured to have a propagation delay.

8. The apparatus according to claim 1, wherein said first delay is generated in response to a first particular number of shift registers and said second delay is generated in response to a second particular number of shift registers.

9. An apparatus comprising:
   means for generating a plurality of data paths in response to an input data signal having a plurality of data items sequentially presented in a first order;
   means for storing each of said data paths in a respective shift register chain; and
   means for generating an output data signal in response to each of said shift register chains, wherein (i) said output data signal presents said data items in a second order different from said first order, (ii) a first group of said shift register chains having a first number of registers is configured to have a first delay, a second group of said shift register chains having a second number of registers different from said first number of registers is configured to have a second delay and a third group of shift register chains having said second number of shift registers is configured to have said second delay, (iii) said input data is transferred to said shift register chains according to a first shift order and said output data is read from said shift register chains according to a second shift order different from said first shift order, (iv) said configuration of said shift register chains is configured to enable said output circuit to present said data in said second order while generating a delay less than a total number of said plurality of shift register chains, and (v) said second order comprises an interleaved order.

10. A method for re-ordering data comprising the steps of:
   (A) generating a plurality of data paths in response to an input data signal having a plurality of data items sequentially presented in a first order;
   (B) storing each of said data paths in a respective shift register chain; and
   (C) generating an output data signal in response to each of said shift register chains, wherein (i) said output data signal presents said data items in a second order different from said first order, (ii) a first group of said shift register chains having a first number of registers is configured to have a first delay, a second group of said shift register chains having a second number of registers different from said first number of registers is configured to have a second delay and a third group of shift register chains having said second number of shift registers is configured to have said second delay, (iii) said input data is transferred to said shift register chains according to a first shift order and said output data is read from said shift register chains according to a second shift order different from said first shift order, (iv) said configuration of said shift register chains is configured to enable said output circuit to present said data in said second order while generating a delay less than a total number of said plurality of shift register chains, and (v) said second order comprises an interleaved order.

11. The method according to claim 10, wherein said second order comprises a sequential presentation of said plurality of data items.

12. The method according to claim 10, wherein step (A) generates said data paths using a finite state machine.

13. The method according to claim 12, wherein step (C) generates said output data signal using said finite state machine.

14. The method according to claim 10, wherein each of said data paths is configured to have a propagation delay.

15. An apparatus comprising:
   an input circuit configured to generate a plurality of data paths in response to an input data signal having a plurality of data items sequentially presented in a first order;
   a storage circuit configured to store each of said data paths in a memory; and
   an output circuit configured to generate an output data signal in response to said memory, wherein (i) said output data signal presents said data items in a second order different from said first order, (ii) a first group of said paths having a first number of registers is configured to have a first delay, a second group of said paths having a second number of registers different from said first number of registers is configured to have a second delay and a third group of said paths having said second number of registers is configured to have said second delay, (iii) said input circuit transfers said input data to said data paths according to a first shift order and said output circuit reads said output data from said data paths according to a second shift order different from said first shift order, (iv) said configuration of said data paths is configured to enable said output circuit to present said data in said second order while generating a delay less than a total number of said plurality of data paths, and (v) said second order comprises an interleaved order.

* * * * *